(12) United States Patent
Wang et al.

(10) Patent No.: US 7,889,575 B2
(45) Date of Patent: Feb. 15, 2011

(54) ON-CHIP BIAS VOLTAGE TEMPERATURE COEFFICIENT SELF-CALIBRATION MECHANISM

(75) Inventors: Yuxin Wang, Sunnyvale, CA (US); Feng Pan, Fremont, CA (US); Byungki Woo, San Jose, CA (US); Trung Pham, Fremont, CA (US); Khin Htoo, Sunnyvale, CA (US)

(73) Assignee: SanDisk Corporation, Milpitas, CA (US)

(*) Notice: Subject to any disclaimer, the term of this patent is extended or adjusted under 35 U.S.C. 154(b) by 102 days.

(21) Appl. No.: 12/235,474

(22) Filed: Sep. 22, 2008

(65) Prior Publication Data

US 2010/0073069 A1    Mar. 25, 2010

(51) Int. Cl.
*G11C 5/14*    (2006.01)
(52) U.S. Cl. ............. 365/189.09; 365/211; 365/189.07; 365/196; 365/210.14; 365/207
(58) Field of Classification Search ............ 365/189.09, 365/211, 189.07, 196, 210.14, 207
See application file for complete search history.

(56) References Cited

U.S. PATENT DOCUMENTS

| | | | |
|---|---|---|---|
| 6,560,152 B1 | 5/2003 | Cernea | |
| 6,735,546 B2 | 5/2004 | Scheuerlein | |
| 6,801,454 B2 | 10/2004 | Wang et al. | |
| 6,839,281 B2 | 1/2005 | Chen et al. | |
| 6,954,394 B2 | 10/2005 | Knall et al. | |
| 7,057,958 B2 | 6/2006 | So et al. | |
| 7,236,023 B2 | 6/2007 | Thorp et al. | |
| 7,269,092 B1 | 9/2007 | Miwa | |
| 7,277,343 B1 | 10/2007 | So et al. | |
| 7,283,414 B1 | 10/2007 | So et al. | |
| 7,342,831 B2 | 3/2008 | Mokhlesi et al. | |
| 7,391,650 B2 | 6/2008 | Mokhlesi et al. | |
| 2003/0152390 A1* | 8/2003 | Stewart et al. | 398/135 |
| 2008/0031066 A1 | 2/2008 | Nandi | |
| 2008/0094908 A1 | 4/2008 | Mokhlesi et al. | |
| 2008/0094930 A1 | 4/2008 | Mokhlesi | |
| 2008/0158947 A1 | 7/2008 | Li et al. | |
| 2008/0158970 A1 | 7/2008 | Sekar et al. | |
| 2008/0158975 A1 | 7/2008 | Sekar et al. | |
| 2008/0159000 A1 | 7/2008 | Li et al. | |

* cited by examiner

*Primary Examiner*—Thong Q Le
(74) *Attorney, Agent, or Firm*—Davis Wright Tremaine LLP

(57) ABSTRACT

Techniques and corresponding circuitry for deriving a supply a bias voltage for a memory cell array from a received reference voltage is presented. The circuit includes a voltage determination circuit, which is connected to receive the reference voltage and generate from it the bias voltage, a temperature sensing circuit, and a calibration circuit. The calibration circuit is connected to receive the bias voltage and to receive a temperature indication from the temperature sensing circuit and determine from the bias voltage and temperature indication a compensation factor that is supplied to the voltage determination circuit, which adjusts the bias voltage based upon the compensation factor.

25 Claims, 10 Drawing Sheets

US 7,889,575 B2

ON-CHIP BIAS VOLTAGE TEMPERATURE COEFFICIENT SELF-CALIBRATION MECHANISM

FIELD OF THE INVENTION

This invention pertains generally to temperature compensated reading techniques for non-volatile memory devices and, more particularly, to an on-chip temperature coefficient self-calibration method.

BACKGROUND

The characteristics of non-volatile memory devices typically exhibit temperature dependent behavior. For example, in flash or other charge storing memory devices the parameter indicative of the data state stored in a memory cell is a function of the temperature, such as the cell's threshold voltage in an EEPROM device that typically exhibit a more or less linearly decreasing temperature dependence. As more and more data states are being stored within a smaller range of threshold values, the accurate reading of stored data will be improved if the sensing parameters used to distinguish between data states takes account of this temperature variation. Continuing with the flash memory example, to accurate read stored data, the Temperature Coefficient (TCO) of the selected word line bias for read and verify should closely track the cell threshold voltages (Vth) across the temperature range over which the device is likely to used. In multi-level cell operation, the selected word line bias needs to be even more precisely controlled in order to have proper read and verify operation. However, due to process variation, mismatching, packaging stresses, and variations in bandgap or other reference source, the TCO of the selected word line varies, and thus the potential of the selected word line changes. In some circumstances, this variation can lead to greater margins needing to be allotted for separation of cell Vth values during the read and verify operation.

SUMMARY OF THE INVENTION

A technique and corresponding circuitry for deriving a supply a bias voltage for a memory cell array from a received reference voltage is presented. The circuit includes a voltage determination circuit, which is connected to receive the reference voltage and generate from it the bias voltage, a temperature sensing circuit, and a calibration circuit. The calibration circuit is connected to receive the bias voltage and to receive a temperature indication from the temperature sensing circuit and determine from the bias voltage and temperature indication a compensation factor that is supplied to the voltage determination circuit, which adjusts the bias voltage based upon the compensation factor.

Various aspects, advantages, features and embodiments of the present invention are included in the following description of exemplary examples thereof which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

The various aspects and features of the present invention may be better understood by examining the following figures, in which.

DETAILED DESCRIPTION

By introducing an on-chip Temperature Coefficient (TCO) self-calibration mechanism, the TCO of the selected wordline bias for read and verify operation will be able to track with that of the cell threshold voltages (Vth) across a temperature range. By introducing system feedback into the calibration mechanism, the TCO variation can be more precisely controlled and corrected to the expected value, and therefore, the TCO of the selected wordline bias will be significantly improved. Although the discussion here is in terms of wordline biases, and for read and verify reference levels, it will be understood that the techniques here are more generally applicable to other biases related to the temperature coefficient characteristics.

Figure 1:
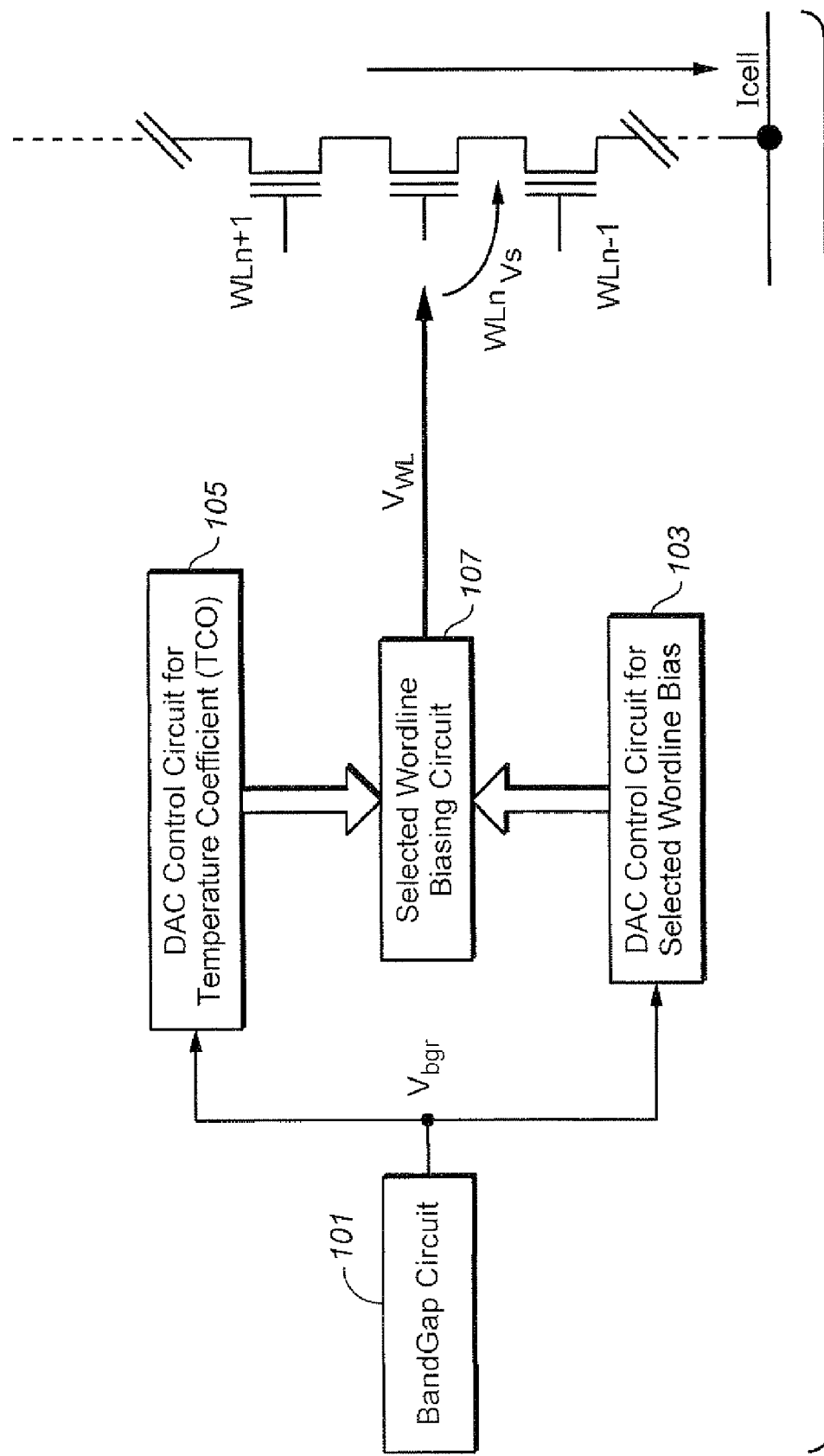
FIG. 1 is a block diagram of an example of bias circuitry that includes temperature compensation.

FIG. 1 is a block diagram of an example of bias circuitry incorporating temperature compensation and that can be used for multi-level memory cell operation. In FIG. 1, the bandgap circuit 101 supplies a reference voltage Vbgr to a control circuit 103 so that it can generate, in the example, the wordline bias voltage $V_{WL}$ for reading a floating gate memory cell in a NAND type architecture. In the arrangement of FIG. 1, the control circuit 103 generates a temperature independent wordline read voltage for the various data states of the memory cell from Vbgr. Vbgr is also supplied to a second control circuit 105, which generates a component for $V_{WL}$ having a temperature coefficient Tco to track the temperature dependent behavior of the memory cells. The biasing circuitry 107 then combines the state dependent contribution from 103 with the temperature dependent contribution from 105 to obtain $V_{WL}$ to supply the selected wordline WLn of an NAND string of EEPROM cells.

More detail and examples concerning temperature related operation and bias circuitry, including sort arrangement described here with respect to FIG. 1, can be found in the following US patents, publications, and applications: U.S.

Pat. Nos. 6,735,546; 6,954,394; 7,057,958; 7,236,023; 7,283,414; 7,277,343; 6,560,152; 6,839,281; 6,801,454; 7,269,092; 7,391,650; 7,342,831; 2008/0031066A1; 2008/0159000A1; 2008/0158947A1; 2008/0158970A1; 2008/0158975A1; Ser. No. 11/772,103; 11/772,097; 11/958,524; 11/958,534; 11/772,015; and 11/772,018. The various embodiments and aspects described here can be variously combined with these references. In addition to these references, additional examples of bandgap reference circuits which are applicable here are given in a U.S. patent application entitled "Bandgap_Temperature Coefficient Trimming Algorithm" by Feng Pan, Yuxin Wang, Jonathan H. Huynh, Albert Chang, Khin Htoo and Qui Nguyen, filed on the same day as the present application. Although the discussion here is given with respect to the wordline bias voltage in a read or verify operation, these techniques extend to other device voltages where temperature dependence needs to be considered, such as examples from these references.

Figure 2:
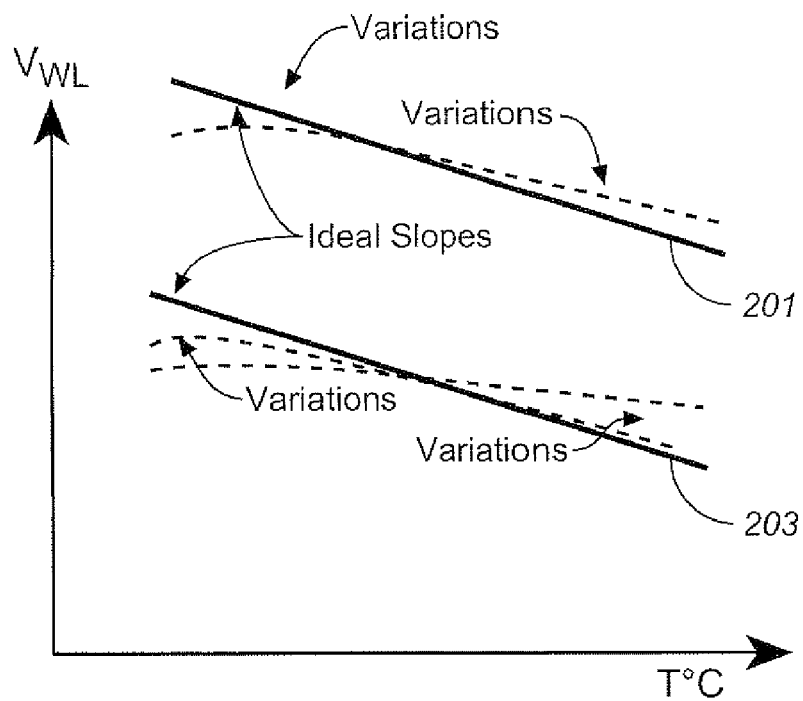
FIG. 2 illustrates the desired wordline potential levels and deviations across a temperature range.

Returning to FIG. 1, some explanation for generating a wordline voltage with a temperature dependence for sensing memory cells can be given with respect to FIG. 2. FIG. 2 shows the temperature behavior of the selected wordline bias for a pair of data states, the higher value shown at 201 and the lower data state at 203. The desired or ideal slopes are shown with solid bold line, while the undesired variations with temperature are shown by the dashed lines. This desired temperature behavior should follow that of the threshold voltage of the memory cells. The physics of memory cells is such that most technologies exhibit some type of temperature dependence. For the example an EEPROM cells, threshold voltages typically exhibit a more or less linear decreasing dependence on temperature over the range of interest. As memory devices are storing more states into smaller threshold windows, the amount of the threshold voltage budgeted to each state decreases; consequently, such temperature induced variations can increasingly lead to error. To help ameliorate this, an arrangement such as in FIG. 1 is used so that the voltages applied to the control gates for a read operation, for example, can track the variations illustrated by FIG. 1.

To provide a control gate read voltage with a fixed temperature coefficient from a circuit as in FIG. 1, the selected word lines are given a bias voltage in read or verify operation which is a combination of a temperature independent part that differentiates between the states of memory cells and a state independent part that approximates the cell's temperature dependence, tracking about, for example, −2 mv/C independently of the data states. If Vbgr is the bandgap reference voltage and Vptat is a voltage with a linear positive temperature correlation, this give a control gate reference voltage level of:

$$V_{WL} = m*Vbgr - n*Vptat,$$

where m is a fixed coefficient for a given threshold state and n is a fixed coefficient to generate the desired temperature coefficient, such as −2 mv/C. By introducing appropriate offsets, this allows the sensing levels to track the cell values over the temperature range.

Figure 3:
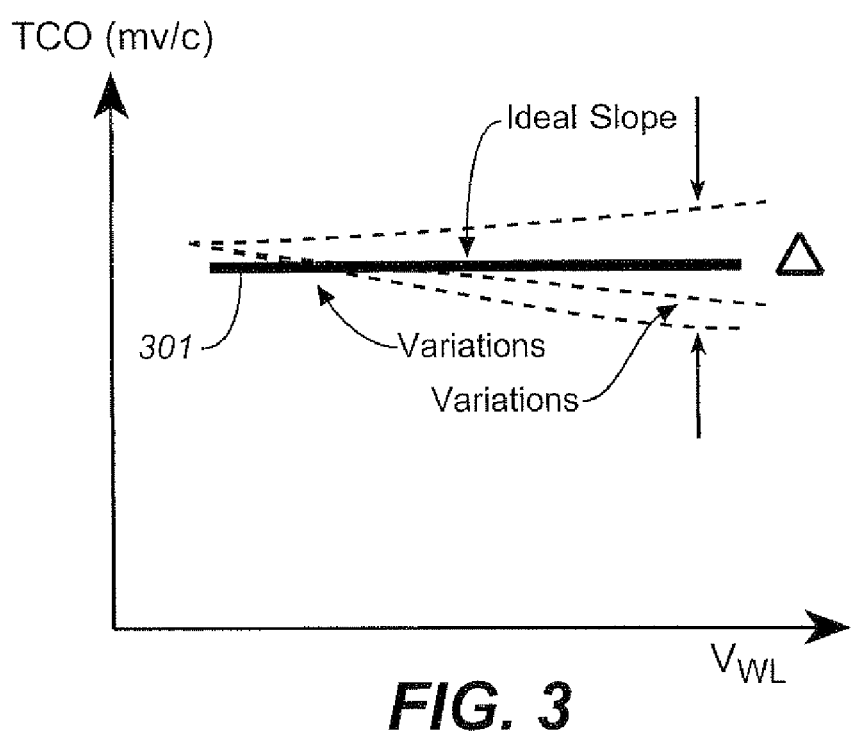
FIG. 3 illustrates the desired temperature coefficient and deviations across a wordline voltage range.

Consequently, the desired wordline voltage supplied from the bias circuit 107 is like that shown in FIG. 2 at 201 or 203, with the ideal slope of the temperature coefficient TCO being independent of the wordline voltage, rather than the sort of deviation shown in the nearby dashed lines. Similarly, FIG. 3 illustrates the desired temperature coefficient across the wordline voltage (solid bold line 301) and the unwanted variations of the temperature coefficient. Although the desired behavior is the linearly decreasing behavior shown in 201 and 203 of FIG. 2 with a flat TCO behavior such as is shown at 301 in FIG. 3, actual read and program verify operations tend to suffer from the sort of TCO variation of the selected wordline bias due to the process variations and mismatching, even though the circuit is trimmed in the production line. Non-ideal behavior in any of the elements can result in the sort of variations from ideal shown in FIGS. 2 and 3.

Figure 4:
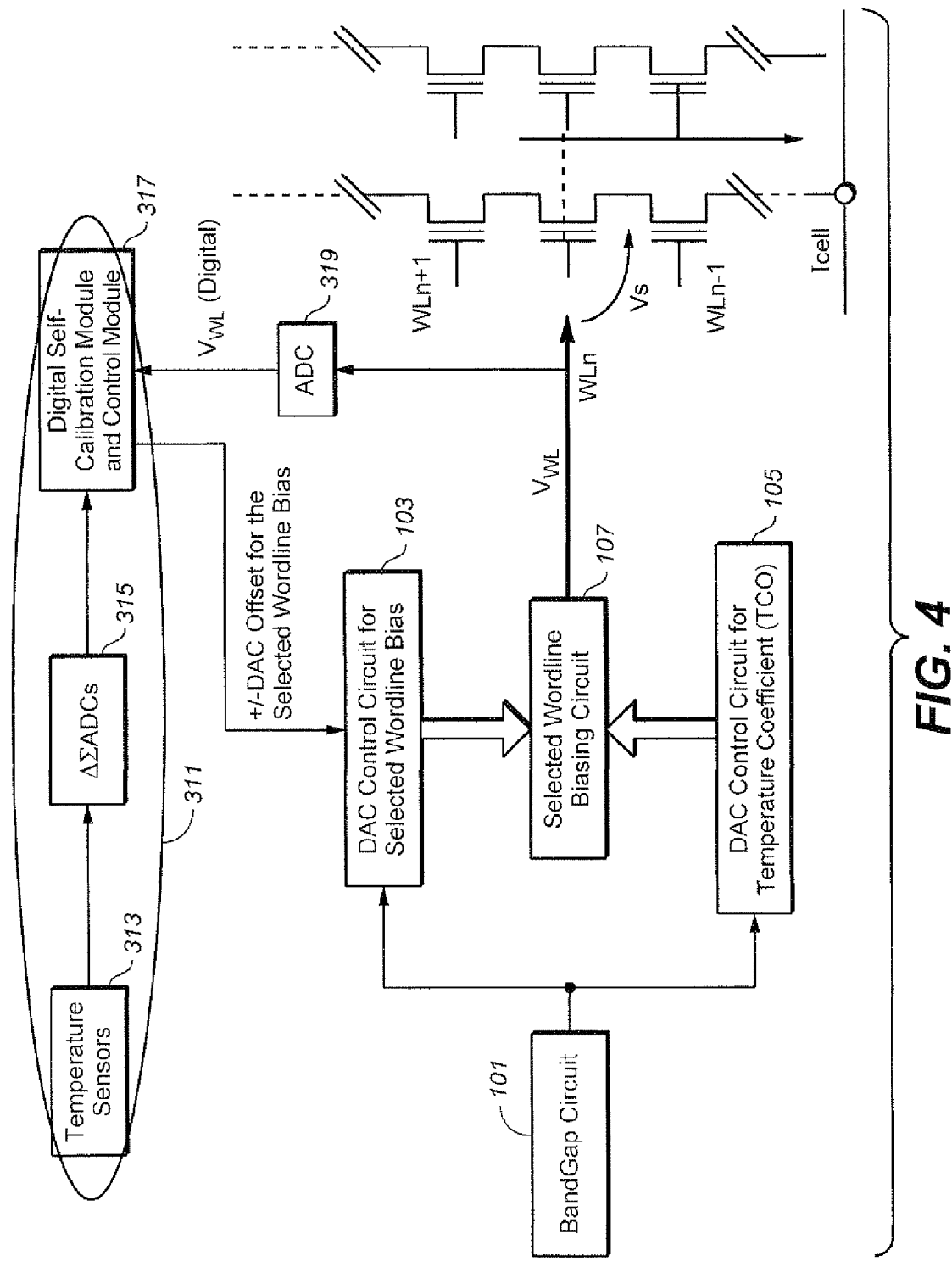
FIG. 4 shows a first embodiment for bias circuit with a temperature coefficient calibration mechanism.
Figure 10:
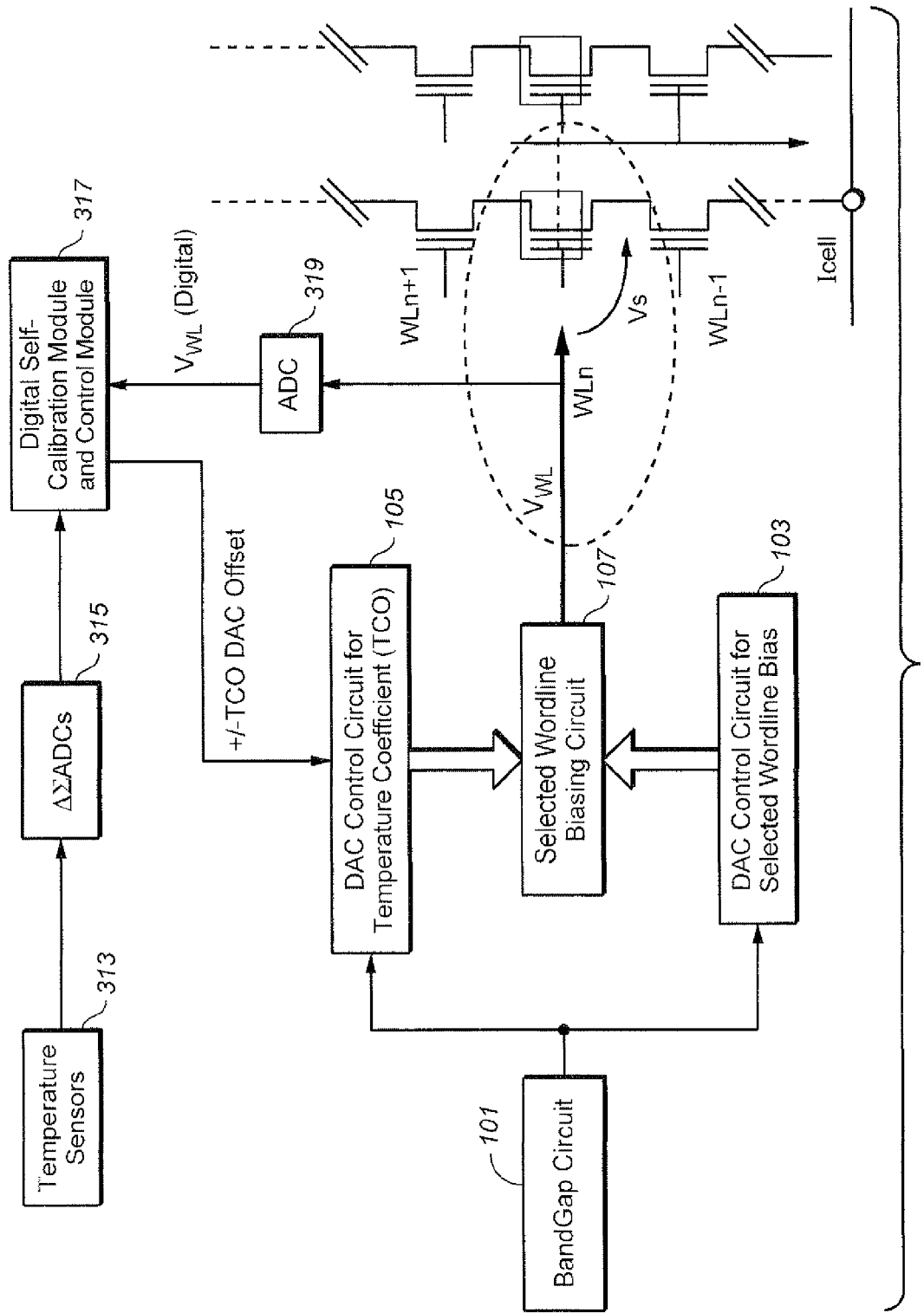
FIG. 10 shows a first embodiment for bias circuit with a temperature coefficient calibration mechanism.

In order to minimize the TCO variation of $V_{WL}$ across the temperature range, the methods descried here introduce an on-chip TCO self-calibration mechanism, a first embodiment of which is shown in the block diagram FIG. 4. The blocks within ellipse 311 are new blocks with respect to the design FIG. 1. A second embodiment is described below with respect to FIG. 10. The difference between the two embodiments of FIGS. 4 and 10 is that in FIG. 4 it is the control circuit 103, which generates the temperature independent component of $V_{WL}$, that is tuned to correct non-ideal behavior, while in the embodiment of FIG. 10 it is the control circuit 105, which generates the TCO component for $V_{WL}$, that is tuned. In either case, system feedback theory is introduced into the embodiments, and the linearity of $V_{WL}$ can be improved significantly and the TCO of the $V_{WL}$ will be able to be controlled more accurately over the temperature range.

Returning to the specific embodiment of FIG. 4, the elements 101, 103, 105, and 107 can be the same as used in FIG. 1. The elements in 311, the temperature sensor(s) 313, delta-sigma modulators 315, and calibration and control modules 317, along with the analog to digital converter 319, have been added. (Note that with respect to FIG. 1, in FIG. 4 the relative placement of elements 103 and 105 have been switched in the block diagram.) In many applications, just one on-chip temperature sensor 313 will serve the purpose, but if more accurate results, a total of, say, 3 or 4 on-chip temperature sensors can be deployed and possibly selecting 2 out of the 3 or 4 to supply values to a delta-sigma modulators 315. Delta-sigma modulators 315 convert the (typically analog signal) temperature value into the digital domain in order to monitor the temperature change. If multiple sensor signals are used, their values would also be combined. This conversion preferably should have sufficient accuracy across entire temperature range within the chip specification.

The (here digital) TCO Self-Calibration module 317 is triggered when the temperature variation is larger than a certain range, such as temperature changes of more than 15 C. or 20 C. The comparison for the temperature change can be set with respect to the previous recorded temperature or with respect to one fixed temperature (which could be set at the trimming phase). Detailed explanation of these two variations will be illustrated later. After TCO Self-Calibration module 317 is triggered, in FIG. 4 the selected wordline biasing $V_{WL}$ level will be calibrated by either fine tuning DAC control of the selected wordline bias element 103. (Alternately, the process could fine tune the DAC control of the TCO setting 105, as discussed below with respect to FIG. 10.) The value of the actual sampled $V_{WL}$ level, converted and supplied from ADC 319, is then compared with the expected $V_{WL}$ level as calculated, for example, as:

$$V_{WL(expected)} = V_{WL(previous\ recorded)} \pm \Delta \text{Temp}_{measured} (°C.)*TCO(mv/°C.),$$

Figure 5:
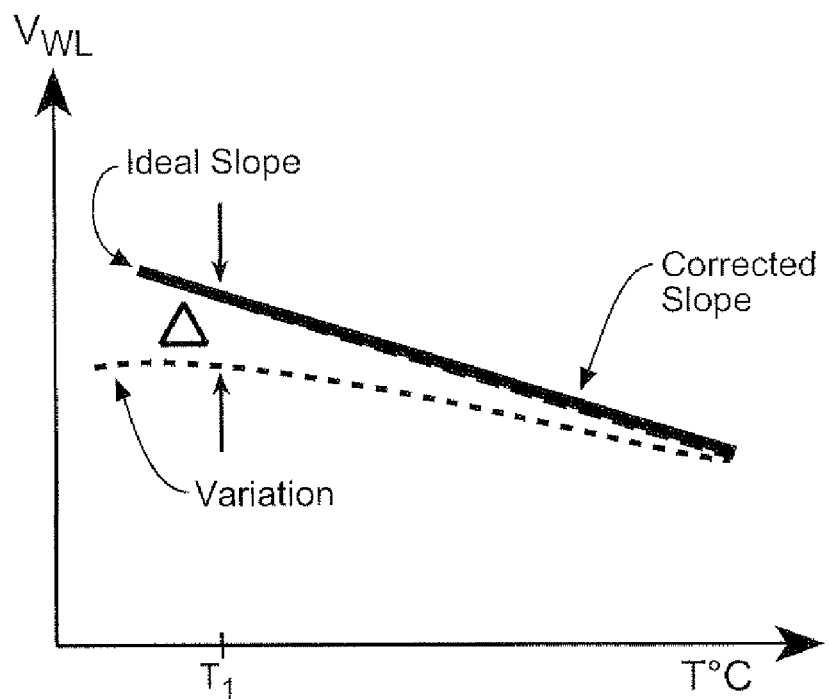
FIG. 5 illustrates the corrected slope of a wordline voltage with temperature.
Figure 6:
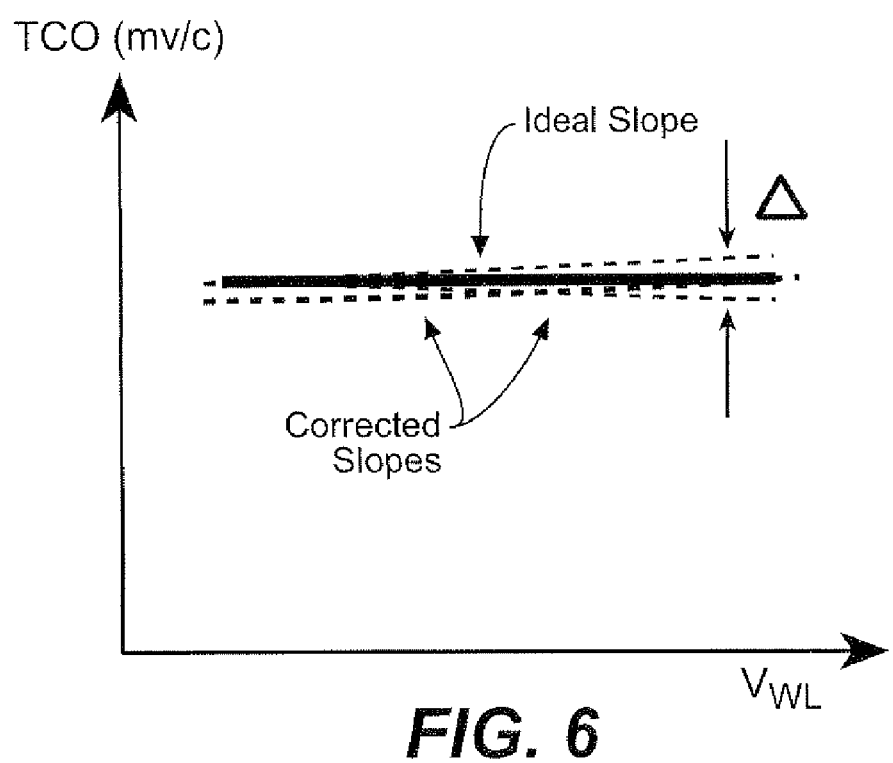
FIG. 6 illustrates the corrected slopes for the temperature coefficient with wordline voltage.

The process is illustrated in FIGS. 5 and 6, which correspond to FIGS. 2 and 3, respectively. The variation that is being corrected (shown in FIG. 5 as the dotted line, resulting in a difference of Δ in $V_{WL}$ at T1 for example) would be determined and the variation value would be corrected up to lie along the ideal slope. In FIG. 5, the ideal slope is again the solid line, with the corrected slope lying on and being largely coincident with the desired slope, but slightly visible in this example as the broken line just slightly visible underneath the ideal value near the middle of the range. The corresponding corrected slope in TCO is similarly shown in FIG. 6, where the corrected slope again lies upon the ideal value, save some tolerance error or offsets. This operation can be parallel processed with other normal memory operations in order to save time. Only the chip needs to inquiry about the self-calibration mode before it enters read and verify operations.

Figure 7:
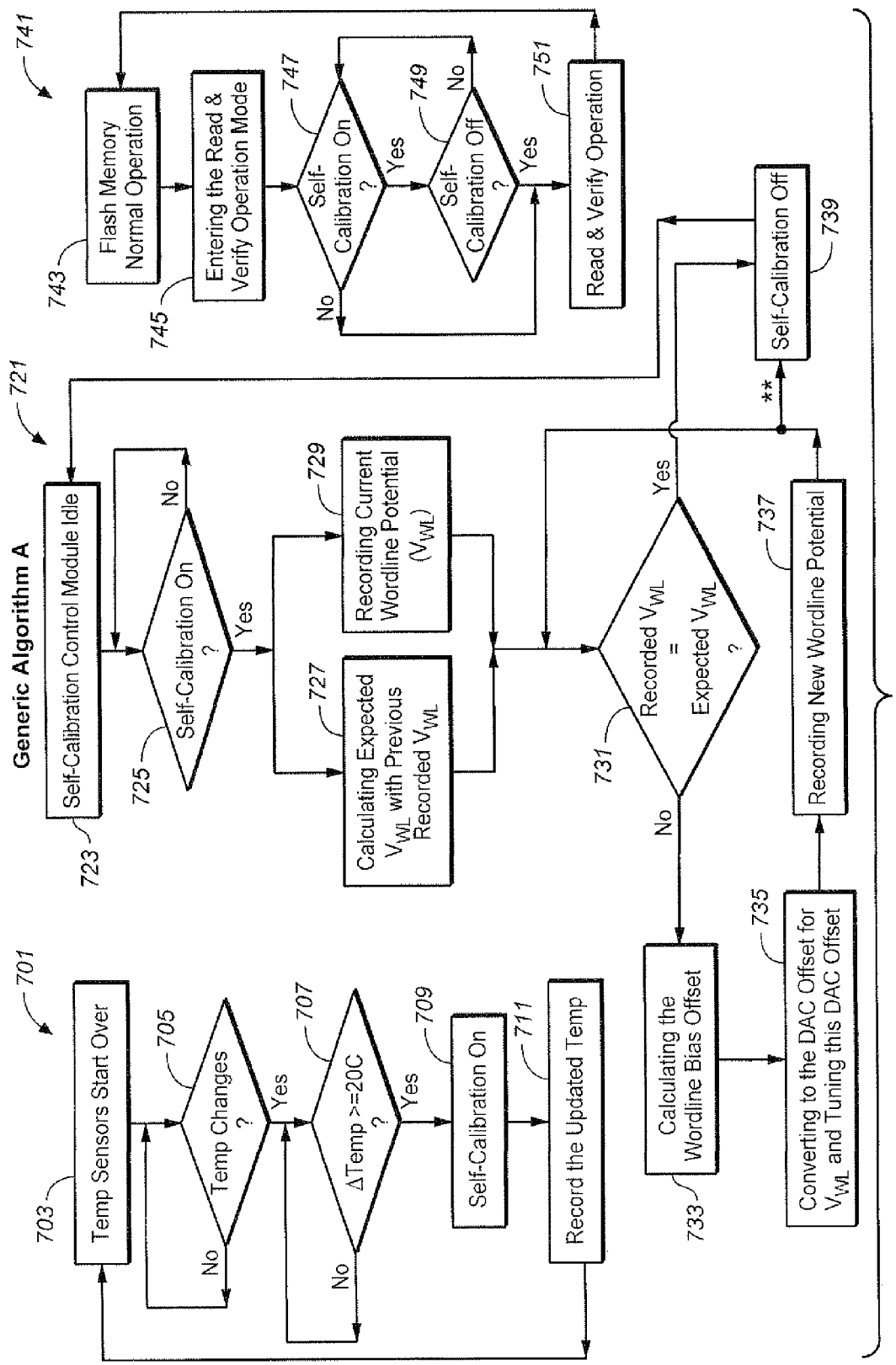
FIG. 7 shows a first exemplary embodiment for an algorithm for temperature coefficient calibration.

One should note that, the trimming methodology and trimming procedures in the embodiments presented here is similar in a number of basics to the methodology for given in FIG. 1 for a flash memory chip. It differs in needing to record several parameters into the lookup table, for example, during the trimming phase for the device. These parameters will be used as reference points during the temperature sensing, ADC sampling, and the self-calibration calculation. One of these parameters is the reference temperature during trimming, $T_{trim}$, which is used to calibrate the on-chip temperature sensors and also used as reference for temperature moving range. (A typical trimming temperature is usually set at higher temperature.) Also recorded is the selected wordline bias at different levels at the trimming temperature with respect to the data levels of the memory cells. In addition, the on-chip ADCs need to be calibrated during the trimming phase. The TCO stepsize and TCO information do not need to be trimmed and can be same as with the method related to FIG. 1. Accordingly, a first exemplary algorithm ("generic algorithm A") for the on-chip TCO self-calibration is shown in FIG. 7 and some detail of its operation described in the next paragraphs.

According to the generic algorithm A of FIG. 7, there are three modules, where both here and in the other algorithms below, these may be implemented in hardware, firmware, or a combination of these, as will familiar to those who work in the art. The first module (on the left side) will be Temperature Sensing Module 701. The function of this module is to monitor the temperature changes during the chip operation. From the start point at 703, the temperature is monitored (705) and when the temperature changes more than certain range (by comparing with the previous recorded temperature at 707), then the self-calibration process begins at 711, such as by setting a flag. The Self-Calibration command is triggered at 709 and the operation enters the second module, Self-Calibration and Control Module 721. In this example temperature change is set at about 20 Celsius degree for triggering the Self-Calibration Module. If the temperature change is less than certain range, the entire self-calibration module will be idle and would not interrupt the normal Flash Memory Operation. After the self-calibration module is entered at 709, the updated temperature is recorded at 711 and the temperature sensing module goes back to 703.

It should be noted that the reference temperature could be either the previous updated temperature or the trimming temperature. In the generic algorithm A of FIG. 7, the reference temperature will be the previously updated temperature of 711, except that, during the first time operation after power-on, the reference temperature is the chip trimming temperature, after which the reference temperature will be the previously recorded temperature for blocks 705 and 707. This is why FIG. 7 is referred to here as the generic algorithm. Another possibility is that the control block will always compare the measured temperature with the trimming temperature and is addressed below in algorithm B of FIG. 9.

Returning to the Self-Calibration and Control Module 721, once the self-calibration is on at 709, the Self-Calibration and Control Module 721 leaves the idle state at 723. Once triggered at 725, the expected wordline bias $V_{WL}$ at current temperature will be calculated ate 727, based on the knowledge of the temperature range, the recorded previous wordline bias and the targeted TCO information. Since the $V_{WL}$ is expected to be linear across temperature range, the following equation, repeated from above, (Equation (1)) can be used to calculate the expected value:

$$V_{WL(expected)} = V_{WL(previous\ recorded)} + \Delta Temp_{Measured} (°C.) * TCO_{Targeted}(mv/c) \quad (1)$$

Meanwhile, this block samples the real wordline bias $V_{WL}$ through ADC 319 (FIG. 4) at 729. At 731 the real measured wordline potential is compared to see whether it is off from the expected value as calculated from Equation (1).

If the expected value is almost equal to the real value, within the certain threshold, then the real value is acceptable and the "self-calibration off" 739 is triggered. The system can proceed to do read and verify operation as necessary without any recalibration. However, if the expected value is different with the real value beyond the threshold, then the real value is not accepted for further read and verify operations and the module will calculate the difference between the expected wordline bias and real wordline bias at 733 and then convert it to the DAC offset of the selected wordline bias control at 735.

In this embodiment of FIG. 4, it should again be noted that the conversion of the difference of the $V_{WL}$ is to the DAC offset element 103 of the selected wordline bias control, not the TCO DAC offset block 105. The embodiment of FIG. 10 discussed below will consider the case where the correction is used to convert the TCO DAC offset. For the operation of flash memory products typical in industry, the step size of the DAC conversion for controlling the absolute $V_{WL}$ in block 103 is able to be established to a given level of accuracy, since the DAC of $V_{WL}$ is usually trimmed during the trimming phase. Therefore, with algorithm A, the expected corrected $V_{WL}$ is able to obtain the ideal value reachable within the minimum offset step size available by tuning $V_{WL}$ DAC. When, as in FIG. 10, the TCO DAC offset is adjusted, the temperature coefficient (TCO) variation value will be able to be corrected to within the order of its minimum step size.

Returning to FIG. 7, after tuning the offset at 735, the new wordline potential is recorded at 737. By continuously tuning with this newly calculated the DAC offset for $V_{WL}$, the updated $V_{WL}$ will be triggered to the wordline in order to finish this self-calibration phase (the path marked ** as shown in Algorithm A) at 739. Alternately, it is also possible to loop back to 731 for $V_{WL}$ to be sampled again and compared with the expected value again for a more accurate application.

Every time when the system needs to enter into read or verify operations, the system will check whether "Self-Calibration" (707) is initially on or not. This is called the third module 741 of the algorithm. This module begins when the memory is in normal operation at 743 and then enters into the read and operation mode at 745. If it is on (747), the normal operation is held temporarily (749) until the calibration off at 739, at which point the calibration is complete and the read or Verify operation is executed at 751.

It should be noted that self-calibration process can be executed in parallel with other normal operations of the system. Also, as noted above, the criterion for triggering the self-calibration mode depends on the temperature changes. The smaller the temperature difference that is set for the comparison of 707, the more accurate the correction that can be achieved across the temperature range for the device. As usual with such engineering choices, this is a design choice where accuracy is balanced against complexity and speed.

As we mentioned above, the temperature comparison can be between the measured temperature and the previously measured temperature, as in algorithm A of FIG. 7, or always with respect to the trimming temperature, will be discussed in "Algorithm B") of FIG. 9, discussed presently. It has also been noted that in the tuning can be done to the block 103, as in FIG. 4, or to the block 105, as will discussed with respect to FIG. 10. Before proceeding to the discussion of FIG. 9, it may be useful to present the relation of the various versions for reference.

Figure 8:
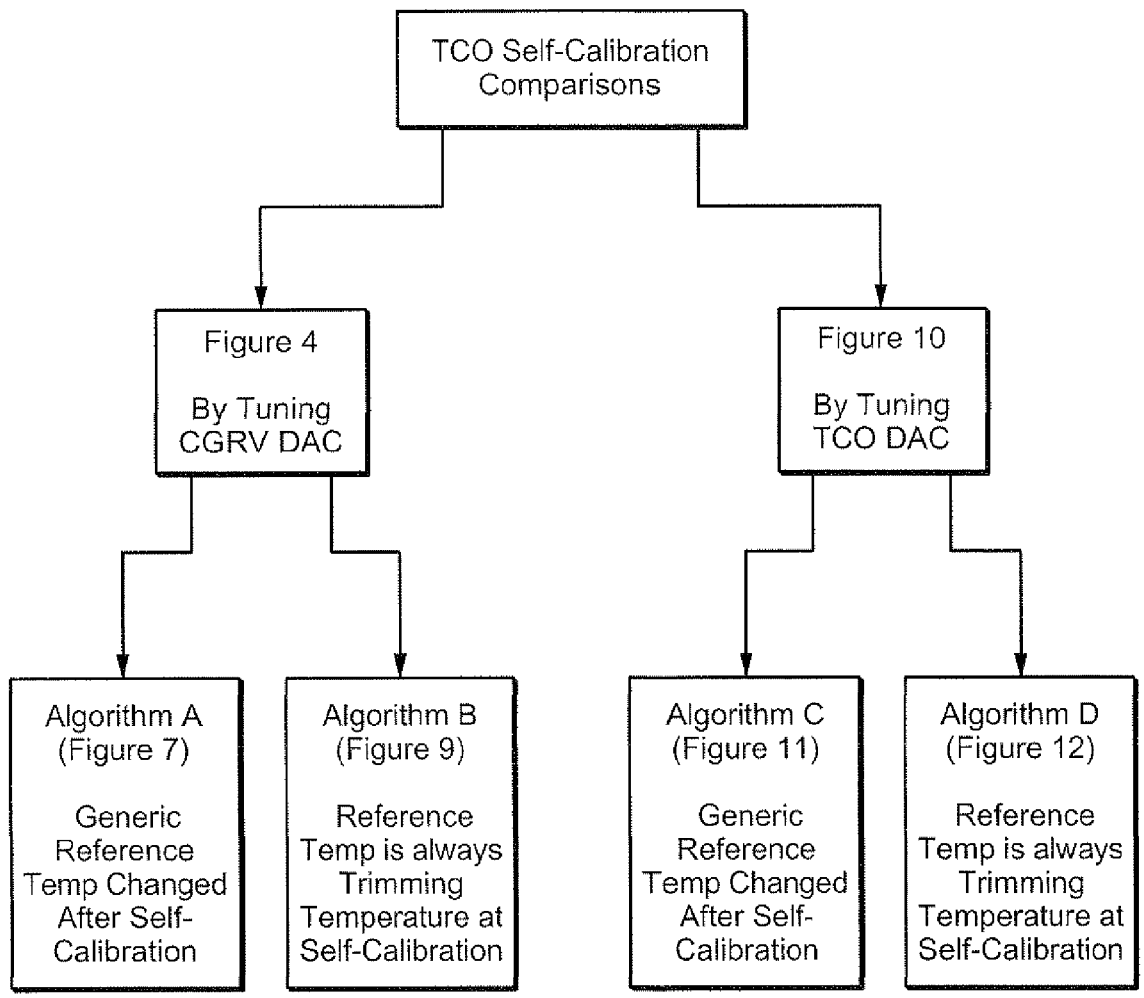
FIG. 8 shows the relationship between the exemplary embodiments and algorithms.

As shown in FIG. 8, the self-calibration process can be used to trim either block 103 of FIG. 1, as done in FIG. 4, or block 105, as discussed below with respect to FIG. 10. In either case, the tuning can be based on the previously recorded temperature (Algorithm A of FIG. 7, Algorithm C of FIG. 11) or with the initial trimming temperature (Algorithm B of FIG. 9, Algorithm D of FIG. 12). Of course variations are possible, such as a hybrid where both blocks 103 and 105 are tuned to some extent or where an additional block supplies the tuning values directly to block 107. Even with Algorithms A and C, at first usage after start up, the "previous temperature" used would be the trimming value.

Figure 9:
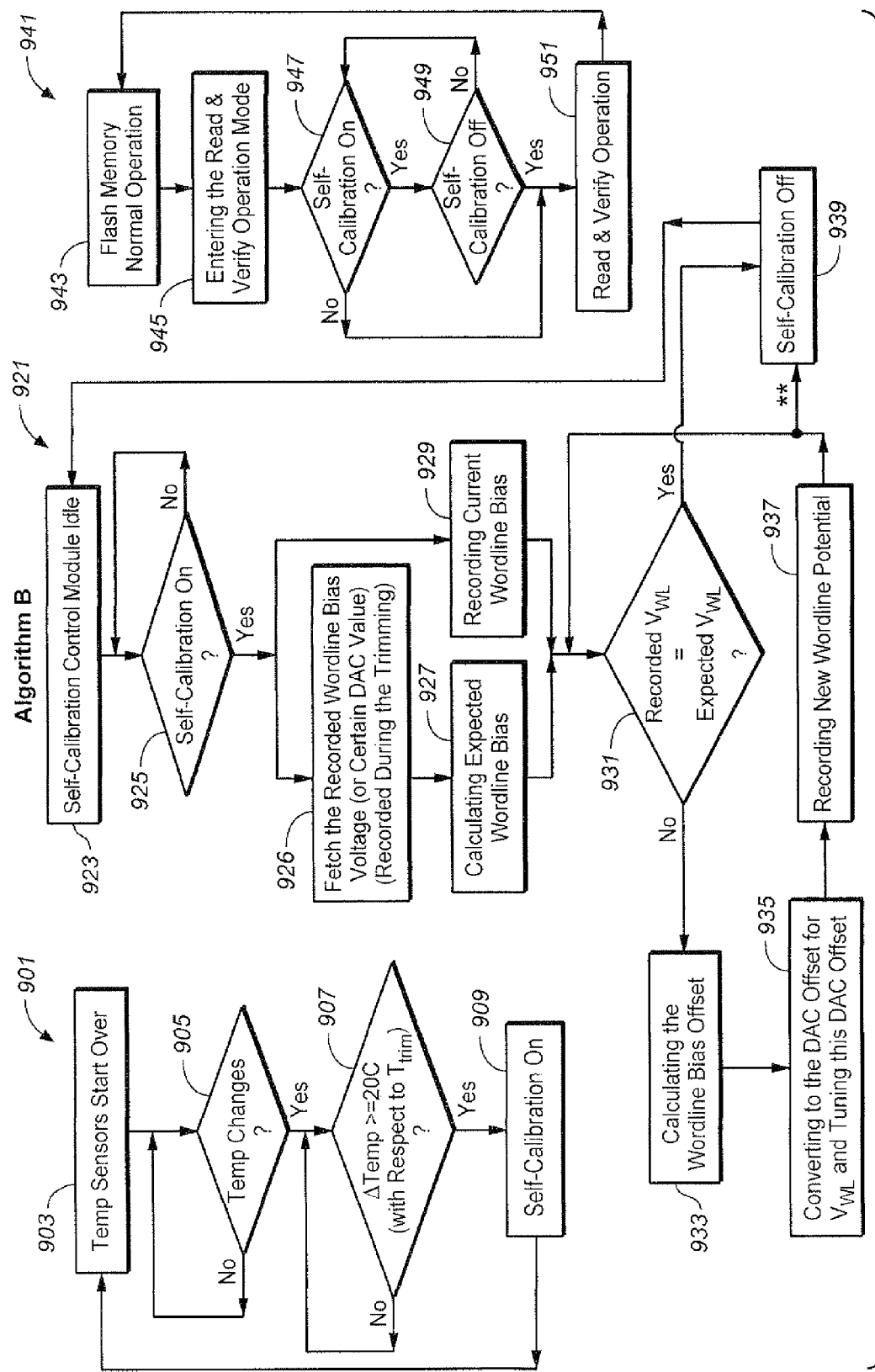
FIG. 9 shows a second exemplary embodiment for an algorithm for temperature coefficient calibration.

Turning to Algorithm B of FIG. 9, the various blocks are given reference numbers corresponding references number for the corresponding elements of FIG. 7. In this specific algorithm B, which combines with the trimmed $V_{WL}$ data at a certain trimming temperature, the temperature sensing module 901 always compare the measured temperature with the trimming temperature $T_{trim}$. Thus, the blocks 903 and 905 are as the corresponding elements of FIG. 7. At 907, though, when the temperature difference greater than 20 degree, for example, with respect to the trimming temperature (as opposed to the previously recorded temperature), then the Self-Calibration and Control Module 921 is triggered at 909. As the reference temperature at 907 is the trimming temperature, there is no need for the equivalent of 711 in FIG. 7.

In Algorithm B, the Self-Calibration and Control Module 921 refers to the recorded wordline bias voltage at the trimming temperature in order to calculate the expected biasing voltage at measured temperature. This is done by including 926, whereas the rest of the operations are same with the generic algorithm A. Here, the expected wordline bias $V_{WL}$ will be calculated as shown in Equation (2).

$$V_{WL(expected)} = V_{WL(recorded\ at\ trimming\ phase)} \pm (\text{Temp}_{Measured(° C.)} - \text{Temp}_{at\ trimming(° C.)})^* \text{TCO}_{Targeted}(mv/c) \quad (2)$$

In this case, the Self-Calibration Module 921 may be frequently turned on when the temperature differs more than 20 C. (for the exemplary values) from the trimming temperature.

Figure 11:
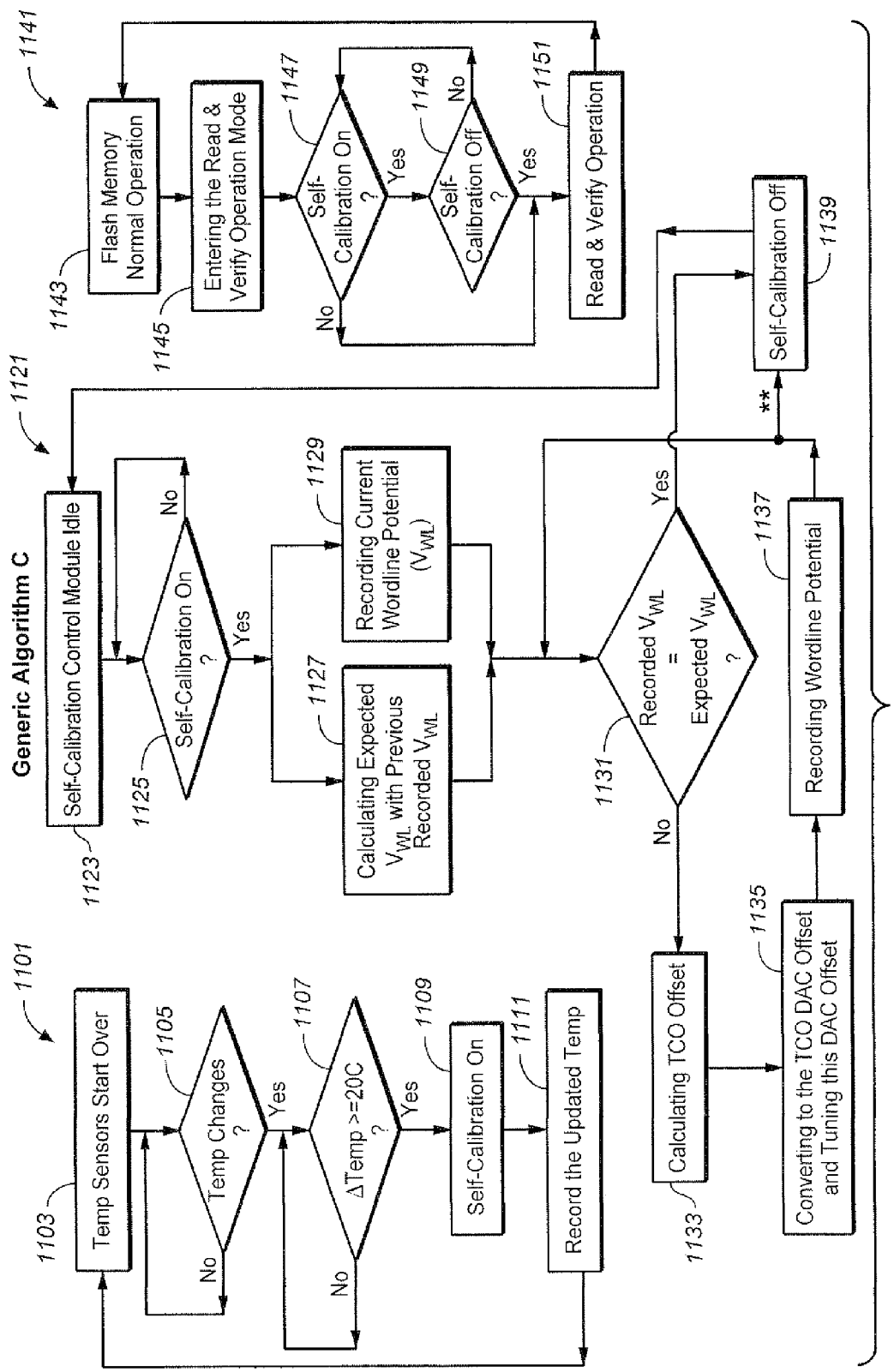
FIGS. 11 and 12 show additionally exemplary embodiments for algorithms for temperature coefficient calibration.

The embodiments where the calibration is focused on calibrating the DAC for the TCO control (block 105), instead of the DAC for $V_{WL}$ control (block 103). This corresponds to the right side of FIG. 8 and is presented in FIG. 10. In this case, the offset alters the digital value input for providing the TCO element of $V_{WL}$. FIG. 11 presents Algorithm C for the calibration process, which is the equivalent of Algorithm A (FIG. 7), but for the embodiment of FIG. 10 instead of FIG. 4.

The difference between this embodiment (FIG. 11) and the previous one (FIG. 4) is that, when the difference between the expected $V_{WL}$ and the real $V_{WL}$ is measured, the Self-calibration and Control Module 1121 will calculate the real TCO of the measured $V_{WL}$ across the temperature range (Equation (3), below). This real TCO information will be compared with the targeted TCO and then the TCO offset will be obtained at 1133. Next, at 1135, based on the observed TCO offset, the new DAC for the TCO control will be calculated (Equation (4)) and the final updated $V_{WL}$ with the updated TCO DAC offset will be achieved (Equation (5)):

$$TCO_{WL(real)} = \frac{(V_{WL(previous\ recorded)} - V_{WL(updated\ recorded)})}{\Delta Temp_{Measured}(° C.)}(mv/c) \quad (3)$$

$$TCO\_DAC\_OFFSET_{WL(real)} = \frac{(TCO_{WL(targeted)} - TCO_{WL(real)})}{TCO\_Step} \quad (4)$$

$$V_{WL(updated\_real)} = V_{WL(previous\_recorded)} + (TCO_{WL(targeted)} + TCO\_DAC\_OFFSET_{WL\_certainTEMP}) \cdot \Delta Temp \quad (5)$$

By adding on the above DAC offset for the TCO control, the selected $V_{WL}$ will be able to have presumptive corrected TCO information (within certain threshold).

Other than these changes, Algorithm C can follow the same process as described above for Algorithm A. Even though, in practice, the expected TCO setting of the selected $V_{WL}$ is more susceptible to the variations of process variation, mismatching and other sources of error, by correcting the TCO offset once, it will bring the real TCO information of the selected $V_{WL}$ more close to the expected value. As if with other exemplary algorithm, if more accurate results are wanted, one or more iterations may be possible before ending the calibration module (illustrated as ** in Algorithm C).

Figure 12:
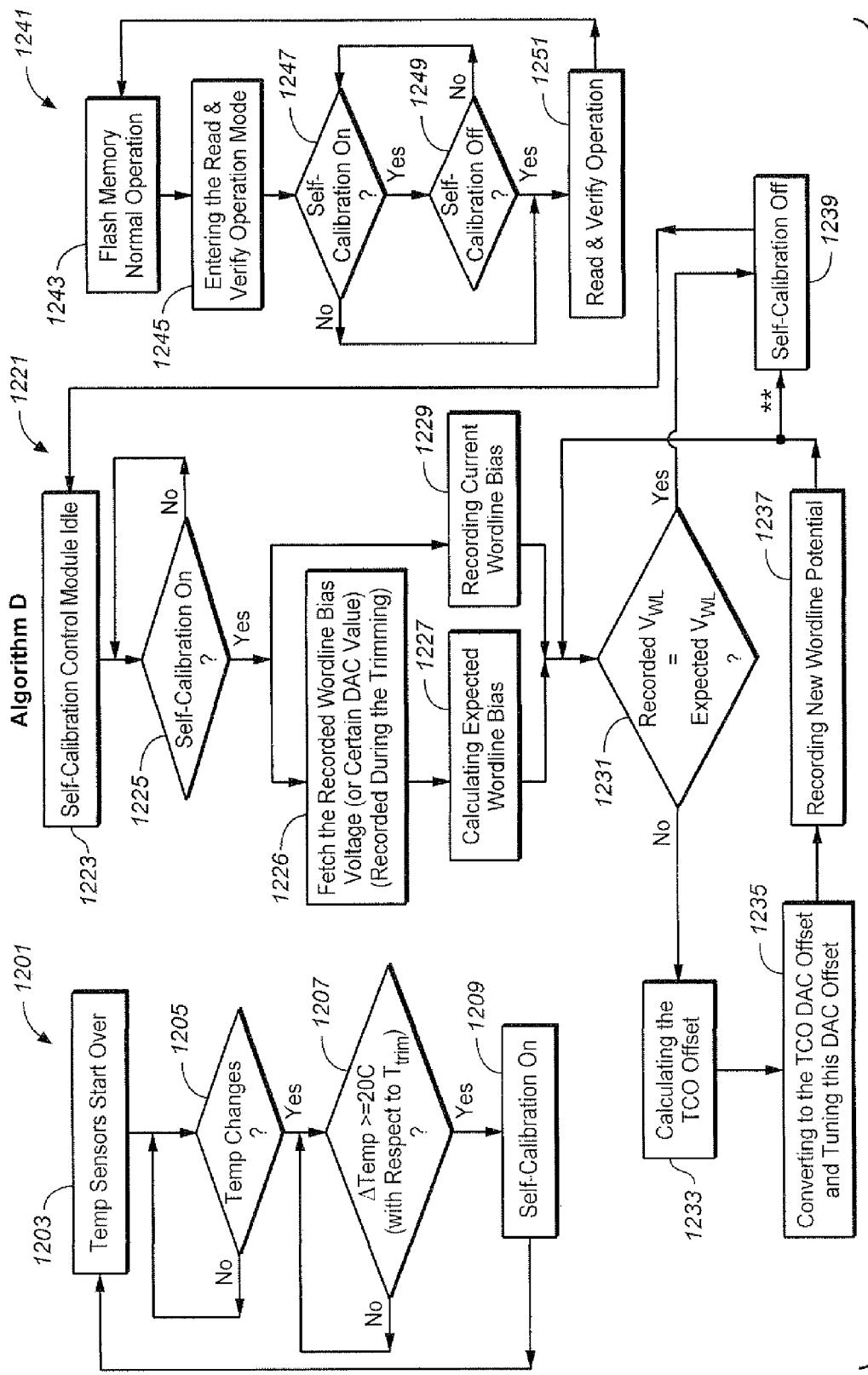

Referring back to FIG. 8, as shown there Algorithm C for the embodiment of FIG. 10 is the equivalent of Algorithm A for the embodiment of Figure. Corresponding to Algorithm B, there is also possible an Algorithm D for the embodiment of FIG. 10, where the temperature comparison is made with the trimming temperature. This is shown in FIG. 12. Much as described above for Algorithm B, the changes of Algorithm D with respect to Algorithm C are in the deletion of the equivalent of element 1111 and the inclusion of 1226. With the appropriate adaptations, the previous discussion consequently apply.

Although the invention has been described with reference to particular embodiments, the description is only an example of the invention's application and should not be taken as a limitation. Consequently, various adaptations and combinations of features of the embodiments disclosed are within the scope of the invention as encompassed by the following claims.

It is claimed:

1. A non-volatile memory device formed on an integrated circuit, comprising:
    an array of non-volatile memory cells; and
    bias circuitry connected to receive a reference voltage and derive therefrom a supply a bias voltage for selective application the cells of the memory cell array to perform memory operations there upon, the bias circuitry comprising:
        a voltage determination circuit connected to receive the reference voltage and generate therefrom the bias voltage;
        a temperature sensing circuit; and
        a calibration circuit connected to receive the bias voltage and to receive a temperature indication from the temperature sensing circuit and determine from the bias voltage and temperature indication a compensation factor, wherein the compensation factor is supplied to the voltage determination circuit, which adjusts the bias voltage based upon the compensation factor.

2. The non-volatile memory device formed on an integrated circuit of claim 1, wherein the voltage determination circuit includes:
- a first control circuit to generate from the reference voltage an output voltage dependent upon the condition to be sensed in the memory cell;
- a second control circuit to generate from the reference voltage an output voltage for temperature compensation not dependent upon the condition to be sensed in the memory cell; and
- a bias voltage generation circuit to combine the output voltages from the first and second control circuits to generate the bias voltage.

3. The non-volatile memory device formed on an integrated circuit of claim 2, wherein the first control circuit receives the compensation factor and adjusts the output voltage based upon the compensation factor.

4. The non-volatile memory device formed on an integrated circuit of claim 2, wherein the second control circuit receives the compensation factor and adjusts the output voltage based upon the compensation factor.

5. The non-volatile memory device formed on an integrated circuit of claim 1, the calibration circuit including:
- an analog to digital conversion circuit to receive and convert the temperature indication to a digital value; and
- a calibration module connected to receive the digital value and the bias voltage, perform a comparison of the bias voltage to an expected value dependent upon the digital value, and determine the compensation factor based upon the comparison.

6. The non-volatile memory device formed on an integrated circuit of claim 5, wherein the comparison is performed with respect to the expected value for a temperature at a previously performed comparison.

7. The non-volatile memory device formed on an integrated circuit of claim 5, wherein the comparison is performed with respect to the expected value for a predetermined trimming temperature.

8. The non-volatile memory device formed on an integrated circuit of claim 5, wherein the compensation factor is determined from a look up table.

9. The non-volatile memory device formed on an integrated circuit of claim 8, where the look up table is set by the manufacture.

10. The non-volatile memory device formed on an integrated circuit of claim 1, wherein the calibration circuit recalibrates the compensation factor in response to detecting a change in the sensed temperature.

11. The non-volatile memory device formed on an integrated circuit of claim 1, further including one or more additional temperature sensing circuits, wherein the calibration circuit is connected to additionally receive a temperature indication from at least one of the additional temperature sensing circuits, the compensation factor being determined from a plurality of the temperature indications.

12. A method operating a non-volatile memory device formed on an integrated circuit, comprising:
- receiving a reference voltage at biasing circuitry formed on the integrated circuit;
- generating by the biasing circuitry of a bias voltage from the reference voltage;
- receiving by the biasing circuitry of an indication of the temperature on the integrated circuit;
- determining from the bias voltage and temperature indication by the biasing circuitry of a compensation factor for the bias voltage;
- adjusting by the biasing circuitry of the bias voltage based upon the compensation factor; and
- supplying the adjusted bias voltage for selective application to cells of a non-volatile memory array formed on the integrated circuit.

13. The method of claim 12, wherein generating the bias voltage includes:
- generating from the reference voltage a first output voltage that is dependent upon the condition to be sensed in the memory cell;
- generating from the reference voltage a second output voltage that is for temperature compensation and is not dependent upon the condition to be sensed in the memory cell; and
- combining the first and second output voltages to generate the bias voltage.

14. The method of claim 13, where the first output voltage is adjusted based upon the compensation factor.

15. The method of claim 13, where the second output voltage is adjusted based upon the compensation factor.

16. The method of claim 12, further comprising:
- converting the temperature indication to a digital value; and
- wherein the determining a compensation factor includes:
  - receiving the digital value for the temperature indication and the bias voltage;
  - perform a comparison of the bias voltage to an expected value dependent upon the digital value for the temperature indication; and
  - determining the compensation factor based upon the comparison.

17. The method of claim 16, wherein the comparison is performed with respect to the expected value for a temperature at a previously performed comparison.

18. The method of claim 16, wherein the comparison is performed with respect to the expected value for a predetermined trimming temperature.

19. The method of claim 16, wherein the compensation factor is determined from a look up table.

20. The method of claim 19, where the look up table is set by the manufacture.

21. The method of claim 12, further comprising:
- monitoring the temperature on the circuit; and
- determining whether a change in the temperature in the circuit exceeds a threshold, wherein determining a compensation factor and adjusting the bias voltage based upon the compensation factor are performed in response to detecting a change in the temperature exceeding the threshold.

22. The method of claim 21, wherein the determining whether a change in the temperature in the circuit exceeds a threshold is based on a comparison performed with respect to the temperature at a previously performed comparison.

23. The method of claim 21, wherein the determining whether a change in the temperature in the circuit exceeds a threshold is based on a comparison performed with respect to predetermined trimming temperature.

24. The method of claim 12, wherein receiving an indication of the temperature on the circuit includes:
- determining from the output of a plurality of temperature sensing circuits a corresponding plurality of temperature indications, the compensation factor being determined from a plurality of the temperature indications.

25. The method of claim 12, further comprising:
- performing a sensing operation on a non-volatile memory using the adjusted bias voltage.

* * * * *